(12) United States Patent
Sutardja (10) Patent No.: US 7,088,534 B2
(45) Date of Patent: Aug. 8, 2006

(54) DISK SYNCHRONOUS WRITE

(75) Inventor: Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 119 days.

(21) Appl. No.: 10/629,164

(22) Filed: Jul. 28, 2003

(65) Prior Publication Data

US 2004/0201913 A1    Oct. 14, 2004

Related U.S. Application Data (60) Provisional application No. 60/451,458, filed on Apr. 8, 2003.

(51) Int. Cl.
*G11B 5/09* (2006.01)

(52) U.S. Cl. .................................. 360/51; 360/73.03

(58) Field of Classification Search ................. None
See application file for complete search history.

(56) References Cited

U.S. PATENT DOCUMENTS

| | | | |
|---|---|---|---|
| 5,535,067 A | 7/1996 | Rooke | |
| 5,706,260 A | 1/1998 | Kishi et al. | |
| 5,905,705 A * | 5/1999 | Takeda et al. | ............... 360/51 |
| 6,222,692 B1 | 4/2001 | Shrinkle | |
| 6,529,456 B1 * | 3/2003 | Koudo et al. | ........... 369/47.48 |
| 2004/0047252 A1 * | 3/2004 | Miyatake et al. | ........ 369/47.12 |

FOREIGN PATENT DOCUMENTS

EP    0 586 236 A2    3/1994

* cited by examiner

*Primary Examiner*—Andrea Wellington
*Assistant Examiner*—Varsha A. Kapadia (57) ABSTRACT

An apparatus, method, and system for writing data to a hard disk drive synchronous with an apparent disk speed. The apparatus, method, and system has a phase-locked loop (PLL) to generate am output clock signal, wherein a clock interpolator responsive to phase rotation control is in the PLL feedback loop. The phase rotation control is proportional to the apparent disk speed, and the PLL output clock signal is also proportional to the apparent disk speed. A second clock interpolator further modifies the PLL output clock signal to provide pre-compensation control.

99 Claims, 9 Drawing Sheets

DISK SYNCHRONOUS WRITE

CROSS-REFERENCE TO RELATED APPLICATIONS

This application claims the benefit of Provisional Application No. 60/461,458 filed Apr. 8, 2003. This application incorporates this provisional application by reference.

BACKGROUND OF THE INVENTION

1. Field of the Invention

This invention relates in general to the field of information storage, and more particularly to read/write channel control devices that can generate timing signals for controlling read/write operations in rotating magnetic storage devices.

2. Description of the Related Art

Hard disk drives (HDD) typically comprise at least one disk having a magnetic medium for storing information, a spindle, a controller for controlling disk rotational speed, a read/write head and actuator assembly for positioning the head over the appropriate disk track, and data channels for reading data from the disk and writing data to the disk. The read/write head reads data from and writes data to the disk in data blocks having either fixed or variable length. A data block comprises a preamble (for acquiring timing signals), timing bits, address bits, data bits, and error correction bits. Data blocks are recorded in sectors in concentric tracks and a track may comprise several sectors. The number of sectors may depend on the radial location of the track on the disk.

In efforts to increase data density, HDD manufacturers write data to disks such that data density is substantially uniform throughout the disk. Uniform density requires a write clock that is synchronized to disk speed (disk speed being defined as the speed of the disk media relative to a specific point such as a write head). There are three sources of variation in disk speed: uncertainty of rotational speed, eccentricities of the disk to the spindle caused by disk slip, and location of data sectors relative to the axis of rotation.

Rotational speed is uncertain because spindle speed control is not perfect in disk drives. Most HDDs have spindle speed specifications of +/−0.1% absolute variation. Because uncertainty in the spindle speed results in a lower format target, engineers design margins to allow the HDD to continue functioning under the worst-case spindle speed variation. For example, a sector written at a fixed +0.1% higher spindle speed and read at −0.1% lower spindle speed will experience a read data-rate 0.2% lower than the nominal read speed. In order for the read timing loop to lock properly to this lower data rate, the data sector requires a longer preamble, resulting in lower format efficiency. Also, in order to prevent writing over part of the preceding or the succeeding sector that was previously written at a different spindle speed, a larger gap between sectors must be allocated to provide a buffer zone. This larger gap also reduces the overall format efficiency of the drive.

In addition to the longer preamble required to enable timing loop lock to a read-back waveform, it is also often necessary to increase the timing loop bandwidth, resulting in a higher read error, rate. Read error rate is lower when the read timing loop bandwidth is lower.

Disk slip is due to manufacturing tolerances creating eccentricities between the disks and the spindle mechanism. When HDDs experience a large lateral shock, the disk may slip relative to the spindle, causing the tracks to be placed on circular paths off-center from the axis of rotation. When reading or writing data, this off-center rotation appears to be a variation of spindle speed. Data read from a sector written prior to a disk slip will have an even larger frequency offset than the nominal value.

Disk slip has sinusoidal sector-to-sector timing variation. The variation in the time interval between sectors appears as a spindle speed variation even though the variation may be due partially to disk slip. Although this component of variation is repeatable around the disk, data written to a disk before the disk slip may be read after the disk slip, resulting in an unpredictable disk read. In many HDDs, a disk slip creates a read frequency offset as large as 0.5% of nominal, which is larger than normal spindle speed variation.

Figure 1:
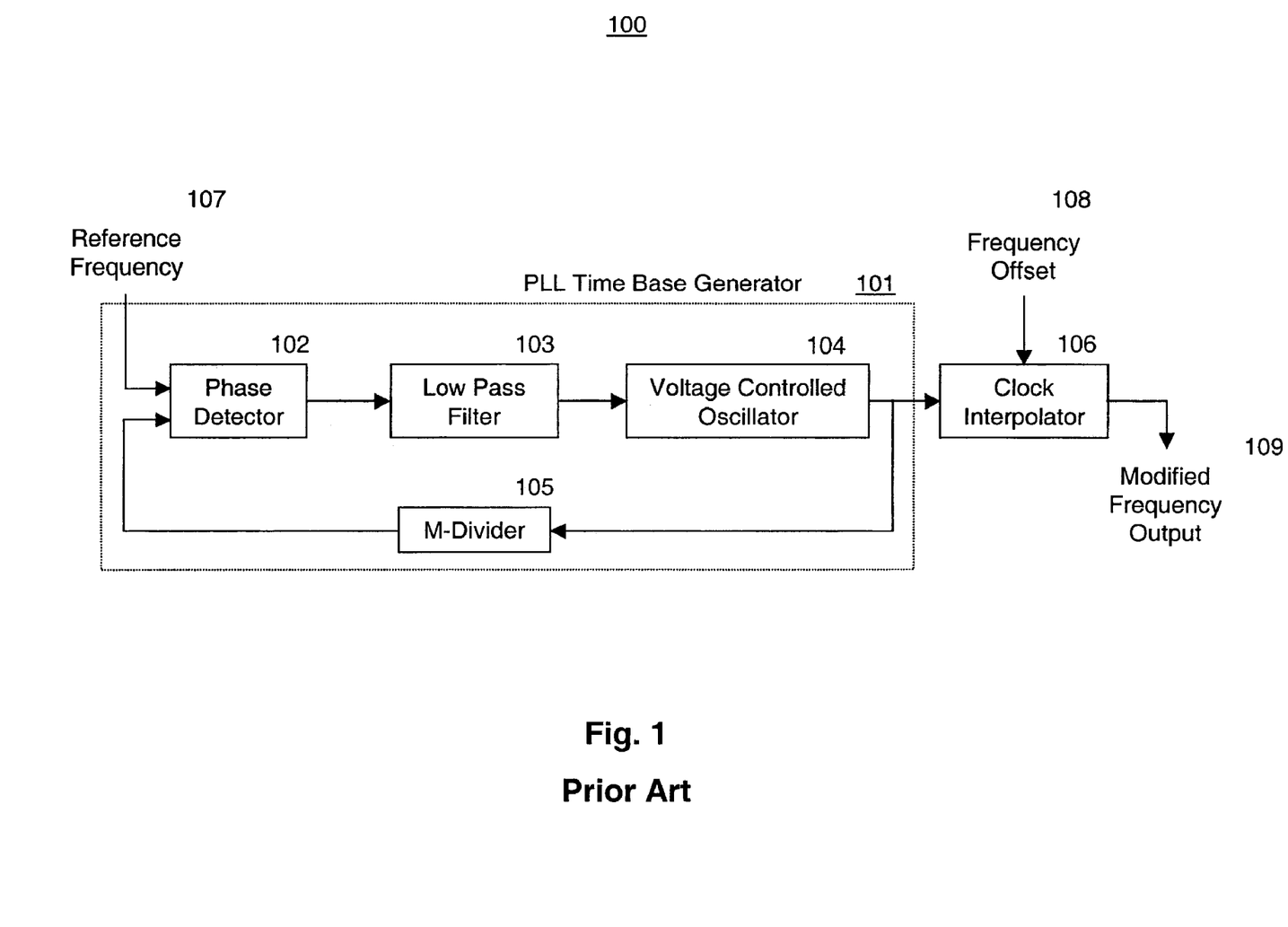
FIG. 1 shows a block diagram of a conventional circuit for adjusting a read channel timing frequency based upon frequency offset control.

Some modern read channels employ digital timing recovery loops and already have a capability to adjust the read back initial frequency offset if the offset amount is known. FIG. 1 shows an example of a phase-locked loop (PLL) circuit for adjusting the frequency of the read channel to compensate for a known frequency offset. The phase detector 102, low pass filter 103, voltage controlled oscillator (VCO) 104, and divider 105 are part of a PLL time base generator 101. The read clock interpolator 106, normally used for read clock timing, is outside the time base generator loop and is responsive to a known frequency offset signal 108 to provide a modified frequency output signal 109.

Figure 2:
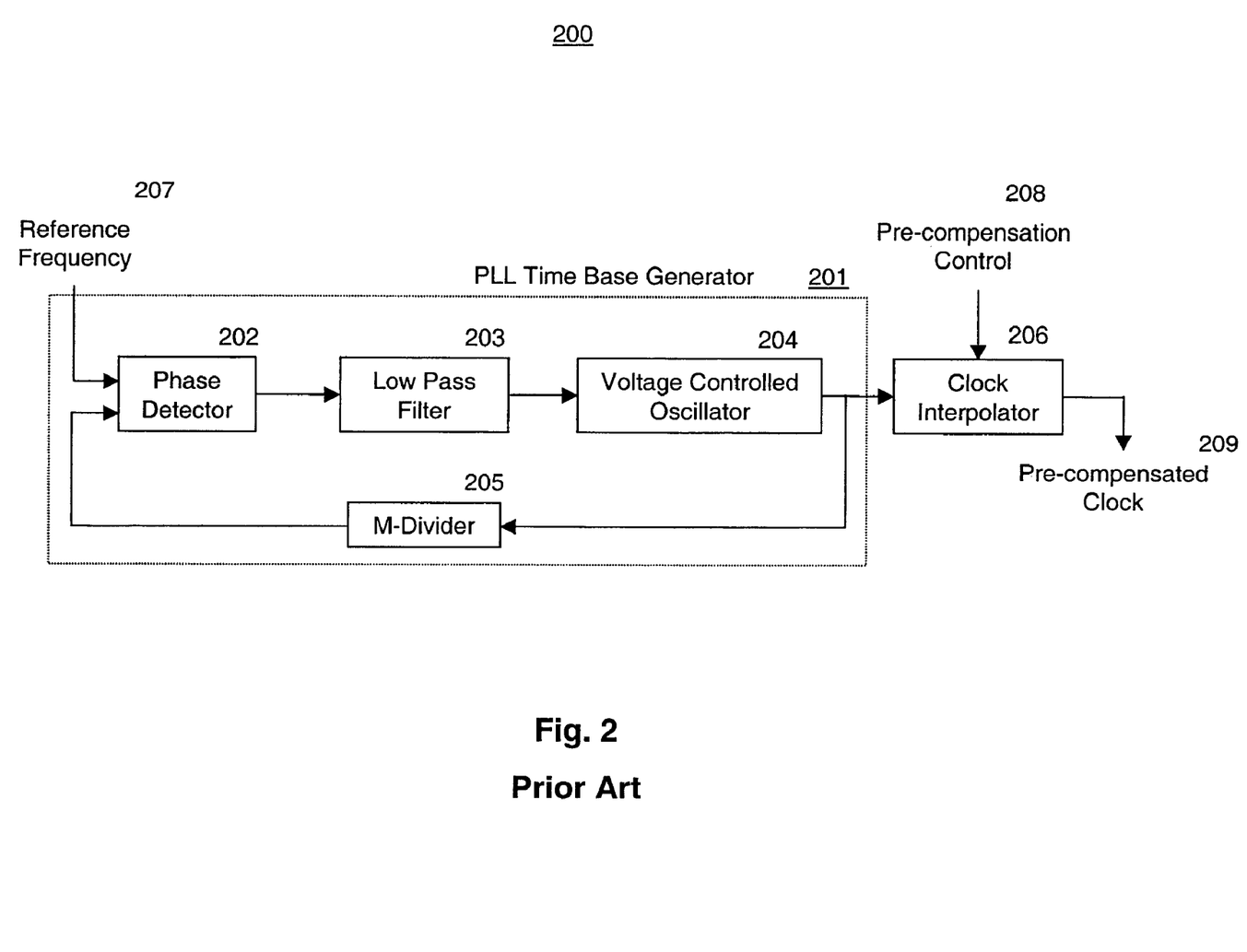
FIG. 2 shows a block diagram of a conventional circuit for adjusting a write channel timing frequency based upon fixed pre-compensation timing values.

Disk speed variation is also due to the location of data sectors relative to the axis of rotation. As a data sector is written farther from the center of the disk, the physical length of the sector increases unless the write clock frequency also increases. Timing circuits also may use one or more interpolators to pre-compensate the write clock to change the write density according to the track location on the disk. FIG. 2 shows that a clock interpolator 206 may also be used to provide pre-compensation for adjusting the data write density necessary to compensate for the track location on the disk. The write pre-compensation control signal 208 adjusts the clock interpolator 206 to account for track location on the disk, thereby providing a pre-compensated clock signal 209. However, if the interpolator has to perform frequency adjustments in addition to pre-compensation adjustments, then the design of the control logic and clock interpolators becomes significantly more complicated.

Therefore, a need exists for circuitry that adjusts the write clock frequency in response to apparent disk speed variations and pre-compensation controls.

SUMMARY OF THE INVENTION

To address the stated need and fulfill other desired objectives, in accordance with one embodiment of the invention, a time base generator provides a clock signal to a clock interpolator responsive to a phase rotation control signal. The phase rotation interpolator adjusts the time base generator output to provide a modified clock signal that is synchronous with the apparent disk speed. A timing apparatus generates the phase rotation control signal, wherein the phase rotation control signal is dependent upon the period between adjacent sector sync-marks. For example, if the period between adjacent sector sync-marks is increased by 0.1 percent, the modified clock signal must be increased by 0.1 percent to provide a constant bit density. This embodiment is most useful when pre-compensation control is provided separately.

In another embodiment, a time base generator provides a clock signal that is already modified to the desired frequency before sending it to the pre-compensation block. In accordance with one embodiment of the invention, a timing circuit incorporates a phase rotation control clock interpolator in the feedback path of the time base generator. The pre-compensation control interpolator is outside the feedback loop. Within the feedback loop, the phase rotation control interpolator increases the VCO output frequency by slowing its own output.

An additional benefit of placing the phase rotation control interpolator in the feedback loop is that the clock output from the VCO is cleaner than the clock output of the interpolator. Interpolators generally have 6 to 7 bit precision and the resulting timing signal has phase noise at the output of the interpolator. By placing the phase rotation control interpolator inside the feedback loop, the output of the phase rotation control interpolator is significantly filtered by time base generator loop filter.

In yet another embodiment, the invention incorporates a mode control for selecting between a read and a write mode. In the read mode, the invention provides a modified frequency clock for acquiring a preamble, wherein the clock is adjusted for the apparent disk speed. In the write mode, the invention provides a clock output that incorporates both an adjustment for the apparent disk speed and pre-compensation control.

DETAILED DESCRIPTION OF EMBODIMENTS

The inventive apparatus controls the write frequency so that it is proportional to the sector-to-sector timing. Therefore, the actual data bit spacing on the disk and the physical size of the sector will be a substantially constant value regardless of the apparent disk speed variation caused by either normal spindle speed variation or disk slip.

Figure 8:
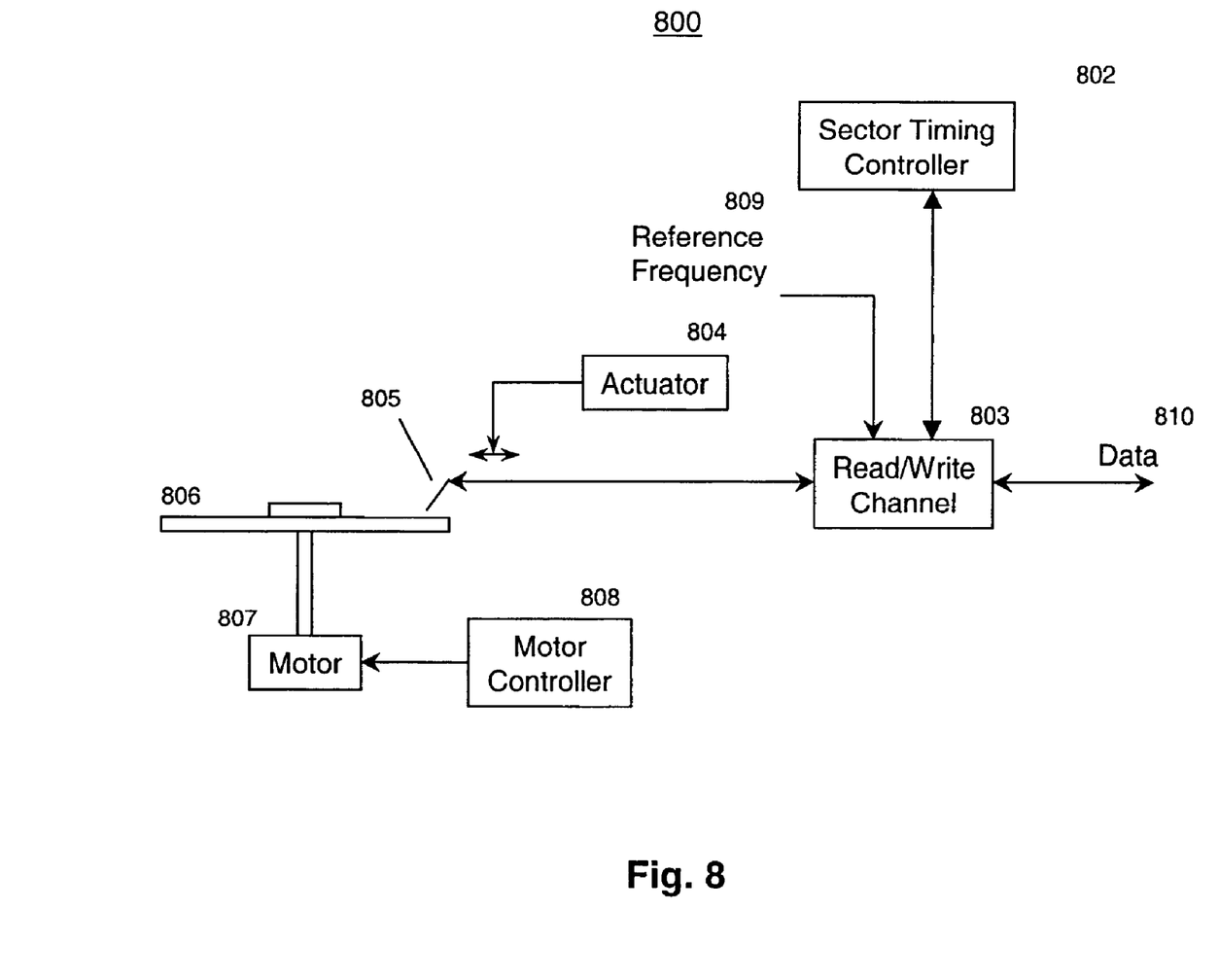
FIG. 8 is a schematic representation a hard disk drive system showing the major components.

As shown in FIG. 8, a hard disk drive system comprises a disk having magnetic media 806. The motor 807 spins the disk at a constant speed and under control of the motor controller 808. While a constant speed is desirable, the speed varies within a certain tolerance. Data 810 passes through a read/write channel 803 to a recording head 805. The actuator 804 positions the recording head 805 over the proper data track, and data is transmitted to or from the read/write channel 803. A clock 801 responsive to a reference frequency 809 provides timing signals to the read/write channel 803, and the sector timing controller 802 synchronizes the clock 801 with the disk rotation. FIG. 8 is intended to be schematic of a hard disk drive, and skilled practitioners in the art will recognize that other configurations are possible.

Initially, a timing circuit measures the time difference between consecutive sector sync-marks. Assuming that the actual spatial distances between sector sync-marks are nearly constant, any change from this number will indicate a need to modify the write speed clock to obtain constant write bit density. For example, if the timing between two consecutive sector sync-marks is increased by 0.1%, the write clock period must also be increased by 0.1% to obtained a fixed write bit size. If any sector sync-mark cannot be found, the timing difference between the missing sync-mark and the two neighboring sync-marks cannot be computed. The last available sector sync-mark timing value then may be used because speed variations usually change slowly. Alternatively, an average of sector sync-mark timing values may be used to supply a missing sector sync-mark measurement.

Sector-to-sector sync mark timing may also be used to set the read frequency offset value. An increased spacing between the sector sync marks will also increase the read-back sampling clock period, resulting in a small difference between the initial read-back waveform and the sampling clock. Because of this small difference, the read-back clock operates with a smaller bandwidth.

Regular phase-locked loop (PLL) time base generators (frequency synthesizers) with M dividers have not provided sufficient frequency resolution to enable writing data at a synchronous frequency. High quality fractional synthesizers do not have sufficient bandwidth and thus may not be fast enough to change frequency quickly. A clock interpolator is already available in a read channel and takes a clock from a time base generator to generate a different frequency clock output very quickly and with very high resolution.

Figure 3:
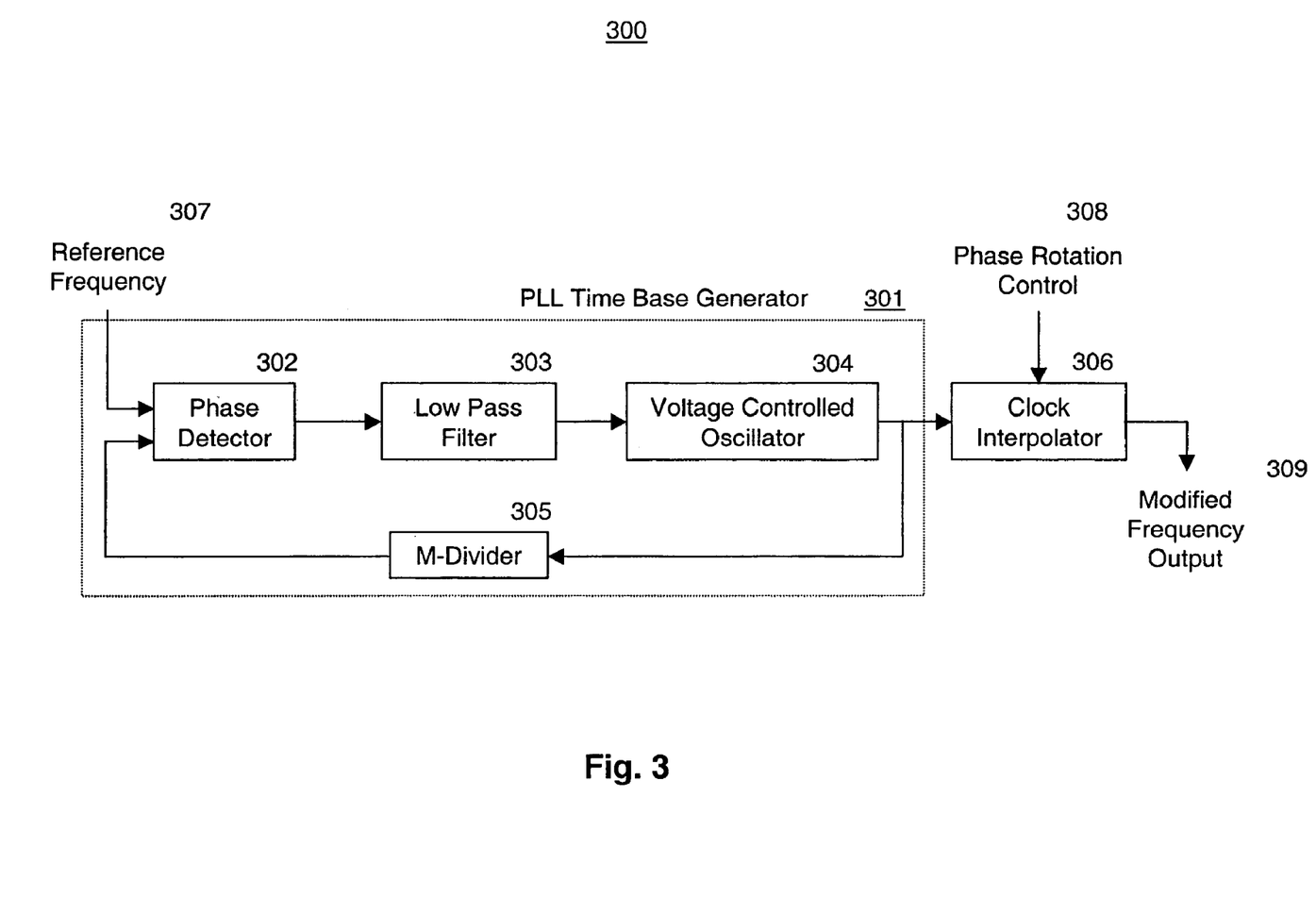
FIG. 3 depicts one embodiment of the invention, wherein a clock interpolator is used to adjust the output frequency responsive to phase rotation.

A first embodiment of the invention is shown in FIG. 3. As in FIGS. 1 and 2, PLL time base generator 301 comprises a phase detector 302 coupled to a low pass filter 303 providing a signal to a voltage controlled oscillator (VCO) 304. The output of the VCO 304 is passed through an M-divider circuit 305 and provides feedback to the phase detector 302. The output of the phase detector is a voltage proportional to the difference of the reference frequency 307 and the output of the M-divider circuit 305. After passing through the low pass filter 303, the phase detector voltage is the input voltage to the VCO 304, wherein the VCO 304 provides an output frequency proportional to the input voltage. The PLL is "locked" when there is a constant difference, usually zero, between the reference frequency 306 and the feedback signal (the output of the M-divider 305).

The clock interpolator 306 modifies the PLL frequency proportional to the phase rotation control signal 306. As is known in the art, an interpolator circuit can shift the phase of a clock signal by small amounts in response to an external signal. In this case, the sector-to-sector timing signal provides the phase rotation control signal 308 to adjust the time base generator 301 output, thereby achieving the modified frequency clock output 309.

In the present embodiment, if the spacing between two consecutive sector timing marks is increased by 0.1 percent, then the period of the modified frequency clock 309 is increased by 0.1 percent. In this manner, data bits written to the magnetic media occupy a substantially fixed amount of space regardless of the apparent disk speed variation. This embodiment may also be used to generate a read clock for read timing acquisition.

This embodiment is useful for systems having a separate pre-compensation control. Combining the phase rotation control and pre-compensation control raises the complexity of controlling the interpolator.

Figure 4:
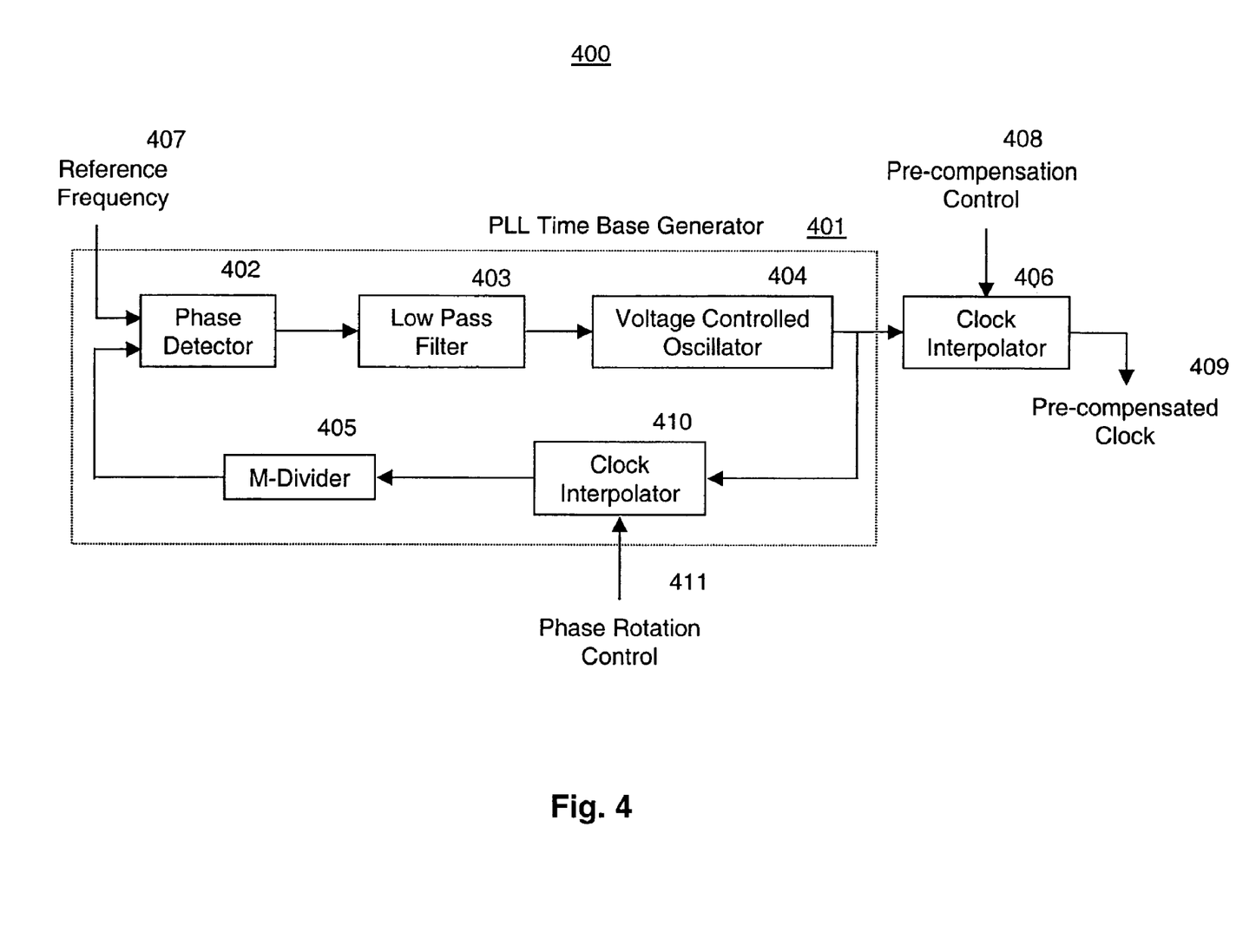
FIG. 4 depicts another embodiment of the invention, wherein one interpolator for adjusting the frequency relative to phase rotation is placed within the feedback loop of a phase-locked loop, and a second interpolator responsive to pre-compensation control is placed outside the feedback loop.

To avoid this additional complication, another embodiment of the invention provides for phase rotation control in the feedback loop and pre-compensation control outside the feedback loop, as shown in FIG. 4. The output of the VCO 404 provides input to both the pre-compensation clock interpolator 406 and the phase rotation clock interpolator 410. The pre-compensation control 408 controls the pre-compensation clock interpolator 406, and the phase rotation control 411 controls the phase rotation clock interpolator 410. The phase rotation clock interpolator 410 and the M-divider 405 are in the feedback loop of the PLL time base generator 401. In this embodiment, the phase rotation clock interpolator 410 controls the VCO 404 inversely. For example, the phase rotation clock interpolator 410 slows to increase the VCO 404 frequency.

One additional benefit of placing the phase rotation interpolator 410 in the feedback path is that the clock output from VCO 404 generally is cleaner than the clock output of an interpolator. Interpolators typically have 6 to 7 bit precision, resulting in phase noise at the output of the interpolator. By placing the phase rotation interpolator 410 inside the feedback loop of the time base generator 401, the low pass filter 403 significantly filters the output of the interpolator 410, thereby providing a cleaner clock signal.

Figure 5:
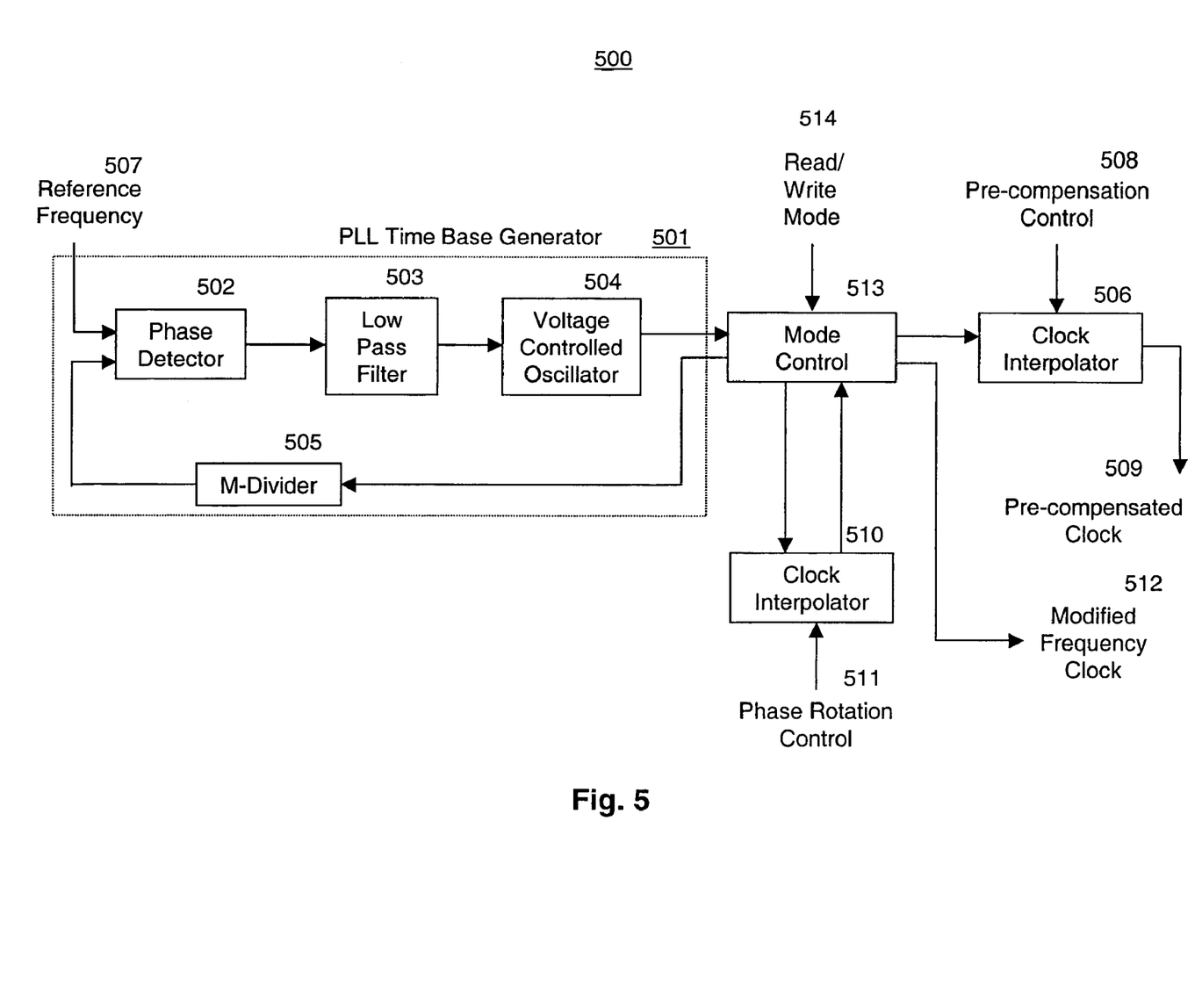
FIG. 5 depicts yet another embodiment of the invention, wherein the circuit may be configured for either writing data to a disk or reading data from a disk.

Another embodiment, shown in FIG. 5, provides an adjusted clock frequency that may be used in both the read mode and the write mode. The mode control 513 determines whether the circuits are in a read or a write mode. In the write mode, the circuit operates as shown in FIG. 4. In the read mode, the PLL time base generator 501 receives feedback directly from the VCO 504, and the phase control clock interpolator 510 is configured to be outside the feedback loop to provide the frequency modulated clock signal 512. In the read mode, the phase rotation interpolator is responsive to a frequency offset signal.

In the write mode, the mode control configures the circuits to incorporate the phase rotation clock interpolator 510 in the PLL time base generator 501 feedback loop, and further configures the VCO 504 to provide a signal to the pre-compensation clock interpolator 506. The pre-compensation clock interpolator then provides the pre-compensated clock signal 509 responsive to the pre-compensation control 508.

Figure 6:
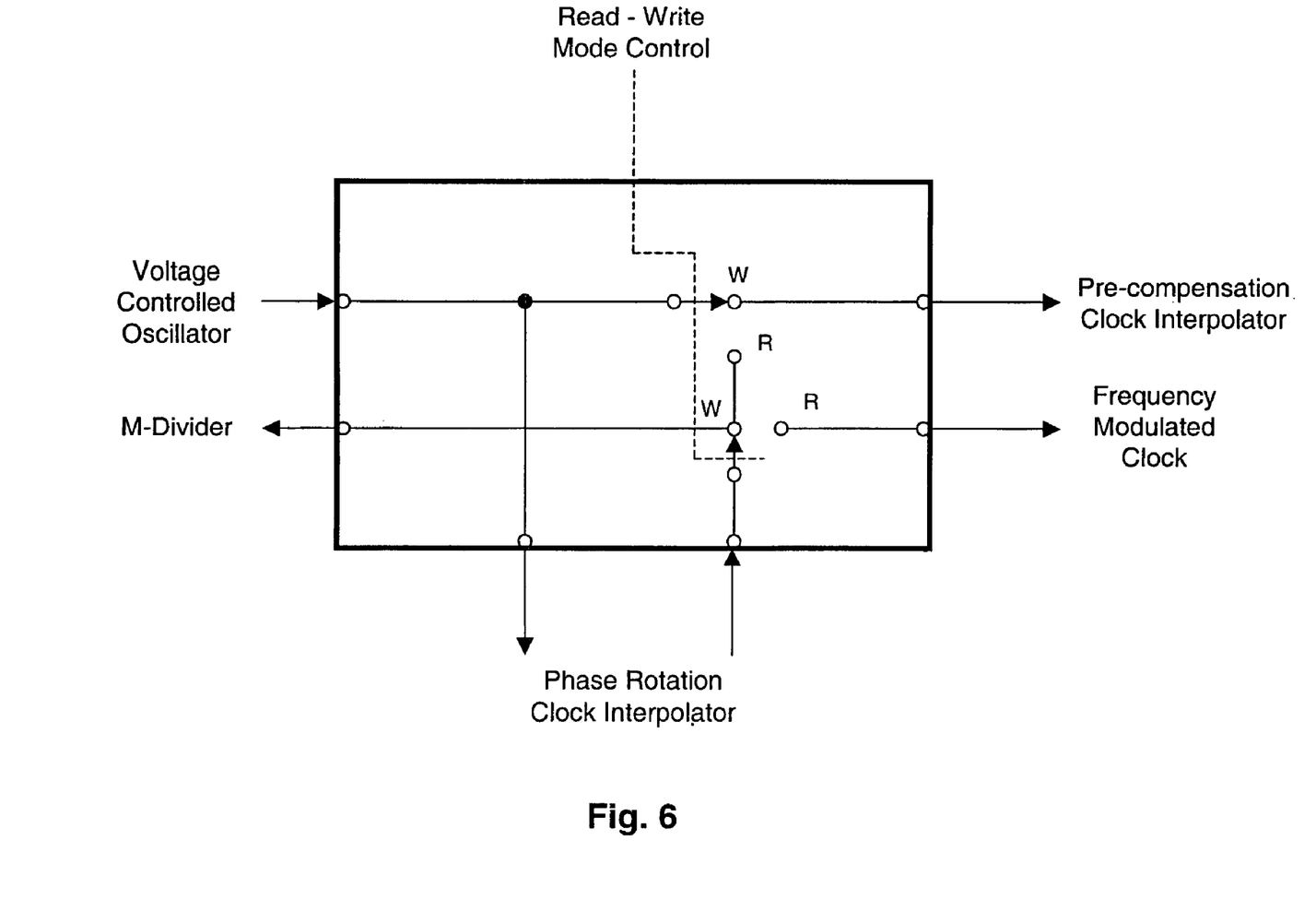
FIG. 6 shows the configuration of the mode control for the write mode.
Figure 7:
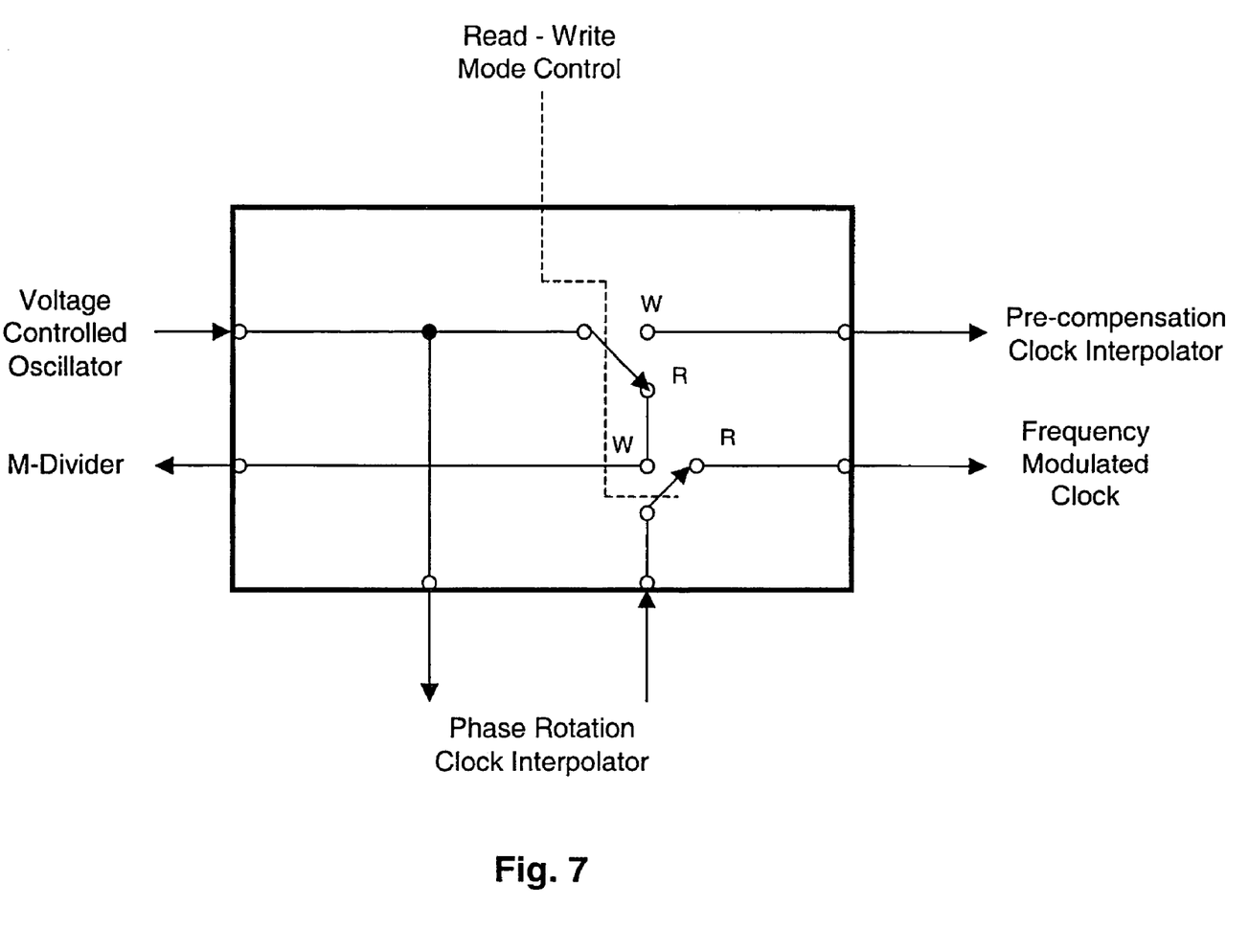
FIG. 7 shows the configuration of the mode control for the read mode.

FIGS. 6 and 7 schematically show how the control mode interconnects with other circuit elements for the write mode (FIG. 6) and the read mode (FIG. 7). Skilled artisans will recognize that implementation of the mode control must be done electronically rather than mechanically as shown.

Figure 9:
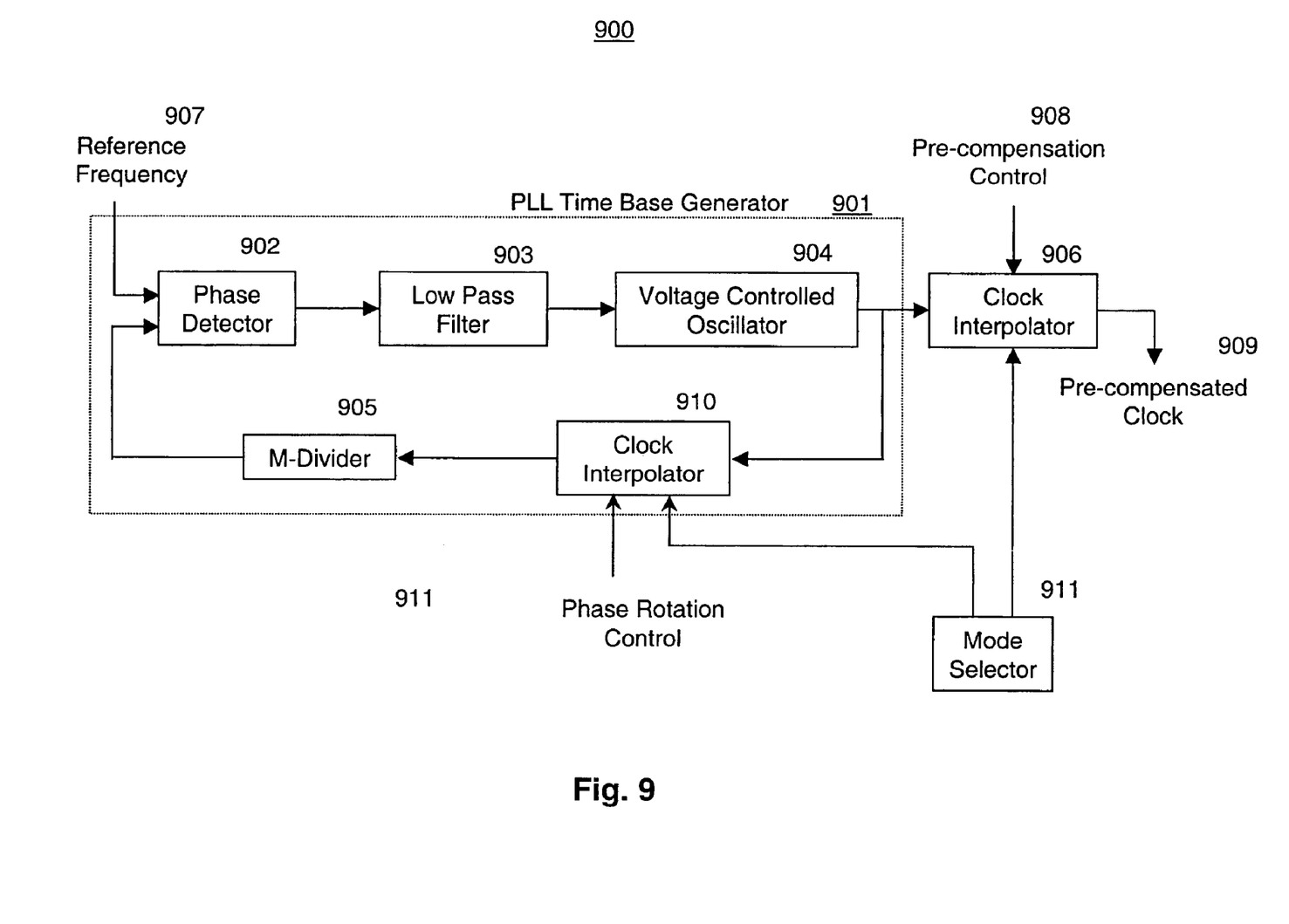
FIG. 9 depicts still another embodiment of the invention, wherein the circuit may be configured for either writing data to a disk or reading data from a disk.

Yet another embodiment, shown in FIG. 9, includes a mode selector 911 for selecting between a read mode and a write mode, wherein the mode selector provides an enabling signal to each of the phase rotation clock interpolator 910 and the pre-compensation clock interpolator 906. The mode selector determines whether the pre-compensated clock signal 909 is responsive to the phase rotation clock interpolator 910 only or both the phase rotation clock interpolator 910 and the pre-compensation clock interpolator 906. When the read mode is selected, the pre-compensation clock interpolator 906 is disabled and the phase rotation clock interpolator 910 is enabled, and the pre-compensated clock signal 909 is responsive only to the phase rotation clock interpolator 910. In the write mode, both interpolators are enabled and the pre-compensated clock signal 909 is responsive to both. When an interpolator is disabled, the interpolator passes the clock signal from the input to the output unmodified. When enabled, the interpolator adjusts the input clock frequency according to the reference, and provides a modified output signal.

Therefore, the foregoing is illustrative only of the principles of the invention. Further, those skilled in the art will recognize that numerous modifications and changes are possible, the disclose of these embodiment does not limit the invention to the exact construction and operation, and accordingly, all suitable modifications and equivalents, fall within the scope of the invention.

We claim:

1. An apparatus for generating a variable frequency clock signal for synchronously writing data to sectors on a rotating disk in a disk storage device, the apparatus comprising:
    a timing apparatus for determining the period of time between two adjacent sectors, wherein the period of time between two adjacent sectors relates to phase rotation;
    a phase-locked loop, responsive to a reference frequency for providing an output clock signal; and
    an interpolator for adjusting the output clock signal responsive to the period of time between two adjacent sectors for synchronously writing data to the rotating disk.

2. The apparatus of claim 1, wherein each sector has a synchronization mark, and wherein the timing apparatus for determining the period of time between sectors measures the time between two consecutive synchronization marks.

3. The apparatus of claim 1, wherein the timing apparatus provides an average of the periods between a plurality of synchronization marks.

4. The apparatus of claim 1, wherein the phase-locked loop further comprises a phase detector, a low pass filter, a voltage controlled oscillator, and a divider, said divider being located in a feedback portion of the phase-locked loop.

5. A method for generating a variable frequency clock signal for synchronously writing data to sectors on a rotating disk in a disk storage device, wherein each sector has a synchronization mark, the method comprising:
    (a) determining a period of time between two adjacent sectors, wherein the period of time between two adjacent sectors relates to phase rotation;
    (b) generating an output clock signal, responsive to a reference frequency;
    (c) interpolating the output clock signal from step (b) in response to the period of time between two adjacent sectors to form an adjusted clock output signal, wherein step (b) is further responsive to the output clock signal.

6. The method of claim 5, wherein determining the period of time between sectors measures the time between two consecutive synchronization marks.

7. The method of claim 5, wherein determining the period of time between sectors provides an average of the periods between a plurality of synchronization marks.

8. An apparatus for generating a variable frequency clock signal for synchronously writing data to sectors on a rotating disk in a disk storage device, the apparatus comprising:
    timing apparatus for determining a period of time between two adjacent sectors, wherein the period of time between two adjacent sectors relates to phase rotation;

timing means having a feedback loop, responsive to a reference frequency for providing an output clock signal;

an interpolation means for adjusting the output clock signal responsive to the period of time between two adjacent sectors for synchronously writing data to the rotating disk.

9. The apparatus of claim 8, wherein each sector has a synchronization mark, and wherein the means for determining the period of time between sectors measures the time between two consecutive synchronization marks.

10. The apparatus of claim 8, wherein the means for determining the period provides an average of the periods between a plurality of synchronization marks.

11. The apparatus of claim 8, wherein the timing means further comprises a phase detector, a low pass filter, a voltage controlled oscillator, and a divider, said divider being located in a feedback loop.

12. The system of claim 10, wherein the read mode is configured to disable the second interpolator.

13. The system of claim 10, wherein the write mode is configured to enable the first interpolator and to enable the second interpolator.

14. An apparatus for generating a variable frequency clock signal for synchronously writing data to sectors on a rotating disk in a disk storage device, the apparatus comprising:

a timing apparatus for determining the period of time between two adjacent sectors, wherein the period of time between two adjacent sectors relates to phase rotation;

a phase-locked loop, responsive to a reference frequency for providing an output clock signal;

a first interpolator for adjusting the output clock signal responsive to the period of time between two adjacent sectors, wherein the first interpolator is located within the phase-locked loop; and a second interpolator, responsive to a pre-compensation adjustment and connected to the phase-locked loop for modifying the output clock signal for synchronously writing data to the rotating disk.

15. The apparatus of claim 14, further comprising a selector for selecting between a read mode and a write mode.

16. The apparatus of claim 15, wherein the read mode is configured to connect the first interpolator to an output of the phase-locked loop.

17. The apparatus of claim 14, wherein each sector has a synchronization mark, and wherein the timing apparatus for determining the period of time between sectors measures the time between two consecutive synchronization marks.

18. The apparatus of claim 14, wherein the timing apparatus provides an average of the periods between a plurality of synchronization marks.

19. The apparatus of claim 14, wherein the phase-locked loop further comprises a phase detector, a low pass filter, a voltage controlled oscillator, and a divider, said divider being located in a feedback portion of the phase-locked loop.

20. The apparatus of claim 14, wherein the first interpolator is located in the feedback portion of the phase locked loop.

21. The apparatus of claim 15, wherein the read mode is configured to disable the second interpolator.

22. The apparatus of claim 15, wherein the write mode is configured to enable the first interpolator and to enable the second interpolator.

23. An apparatus for generating a variable frequency clock signal for synchronously writing data to sectors on a rotating disk in a disk storage device, the apparatus comprising:

a timing apparatus for determining the period of time between two adjacent sectors, wherein the period of time between two adjacent sectors relates to phase rotation;

a selector for selecting between a read mode and a write mode;

a phase-locked loop, responsive to a reference frequency for providing an output clock signal;

a first interpolator for adjusting the output clock signal responsive to the period of time between two adjacent sectors, wherein the first interpolator is located within the phase-locked loop; and a second interpolator, responsive to a pre-compensation adjustment and connected to the phase-locked loop for modifying the output clock signal for synchronously writing data to the rotating disk.

24. The apparatus of claim 23, wherein each sector has a synchronization mark, and wherein the timing apparatus for determining the period of time between sectors measures the time between two consecutive synchronization marks.

25. The apparatus of claim 23, wherein the timing apparatus provides an average of the periods between a plurality of synchronization marks.

26. The apparatus of claim 23, wherein the phase-locked loop further comprises a phase detector, a low pass filter, a voltage controlled oscillator, and a divider, said divider being located in a feedback portion of the phase-locked loop.

27. The apparatus of claim 23, wherein the write mode is configured to connected the first interpolator in the feedback portion of the phase locked loop.

28. The apparatus of claim 23, wherein the read mode is configured to connect the first interpolator to an output of the phase-locked loop.

29. The apparatus of claim 23, wherein the read mode is configured to disable the second interpolator.

30. The apparatus of claim 23, wherein the write mode is configured to enable the first interpolator and to enable the second interpolator.

31. An method for generating a variable frequency clock signal for synchronously writing data to sectors on a rotating disk in a disk storage device, wherein each sector has a synchronization mark, the method comprising:

(a) determining a period of time between two adjacent sectors, wherein the period of time between two adjacent sectors relates to phase rotation;

(b) generating an output clock signal, responsive to a reference frequency;

(c) interpolating the output clock signal from step (b) in response to the period of time between two adjacent sectors to form an adjusted clock output signal, wherein step (b) is further responsive to step (c); and (d) interpolating the adjusted clock output signal from step (c) in response to a pre-compensation adjustment for modifying the output clock signal to generate a variable clock signal.

32. The method of claim 31, further comprising selecting between a read mode and a write mode.

33. The method of claim 32, wherein the read mode is configured to interpolate the output clock signal from step (b) to provide the variable clock signal, and wherein step (b) is responsive to the output clock signal.

34. The method of claim 32, wherein the read mode is configured to disable interpolating the adjusted clock output signal from step (c).

35. The method of claim 32, wherein the write mode is configured to enable interpolating the output clock signal from step (b) and interpolating the adjusted clock output signal from step (c), 36. The method of claim 31, wherein determining the period of time between sectors measures the time between two consecutive synchronization marks.

37. The method of claim 31, wherein determining the period of time between sectors provides an average of the periods between a plurality of synchronization marks.

38. An method for generating a variable frequency clock signal for synchronously writing data to sectors on a rotating disk in a disk storage device, wherein each sector has a synchronization mark, the method comprising:
 (a) determining a period of time between two adjacent sectors, wherein the period of time between two adjacent sectors relates to phase rotation;
 (b) selecting between a read mode and a write mode;
 (c) generating an output clock signal, responsive to a reference frequency;
 (d) interpolating the output clock signal from step (c) in response to the period of time between two adjacent sectors to form an adjusted clock output signal; and
 (e) interpolating the adjusted clock output signal from step (d) in response to a pre-compensation adjustment for modifying the output clock signal to generate a variable clock signal.

39. The method of claim 38, wherein determining the period of time between sectors measures the time between two consecutive synchronization marks.

40. The method of claim 38, wherein determining the period of time between sectors provides an average of the periods between a plurality of synchronization marks.

41. The method of claim 38, wherein the write mode is configured for step (c) to be responsive to step (d).

42. The method of claim 38, wherein the read mode is configured to interpolate the output clock signal from step (c) to provide the variable clock signal, and wherein step (c) is responsive to the output clock signal.

43. The method of claim 38, wherein the read mode is configured to disable interpolating the adjusted clock output signal from step (d).

44. The apparatus of claim 36, wherein the write mode is configured to enable interpolating the output clock signal from step (c) and interpolating the adjusted clock output signal from step (d).

45. A data recording disk drive system for generating a variable frequency clock signal for synchronously writing data to sectors on a rotating disk in a disk storage device, the apparatus comprising:
 a disk having a surface for storing data thereon;
 a controller for controlling rotational speed of the disk;
 at least one head for reading or writing the data;
 an actuator for positioning the head;
 a communications channel for transmitting data to and from the at least one head;
 a timing apparatus for determining a period of time between two adjacent sectors, wherein the period of time between two adjacent sectors relates to phase rotation;
 a phase-locked loop, responsive to a reference frequency for providing an output clock signal;
 a first interpolator for adjusting the output clock signal responsive to the period of time between two adjacent sectors, wherein the first interpolator is located within the phase-locked loop; and
 a second interpolator, responsive to a pre-compensation adjustment and connected to the phase-locked loop for modifying the output clock signal for synchronously writing data to the rotating disk.

46. The system of claim 45, further comprising a selector for selecting between a read mode and a write mode.

47. The system of claim 46, wherein the read mode is configured to connect the first interpolator to an output of the phase-locked loop.

48. The system of claim 46, wherein the read mode is configured to disable the second interpolator.

49. The system of claim 46, wherein the write mode is configured to enable the first interpolator and to enable the second interpolator.

50. The system of claim 45, wherein each sector has a synchronization mark, and wherein the timing apparatus for determining the period of time between sectors measures the time between two consecutive synchronization marks.

51. The system of claim 45, wherein the timing apparatus provides an average of the periods between a plurality of synchronization marks.

52. The system of claim 45, wherein the phase-locked loop further comprises a phase detector, a low pass filter, a voltage controlled oscillator, and a divider, said divider being located in a feedback portion of the phase-locked loop.

53. A data recording disk drive system for generating a variable frequency clock signal for synchronously writing data to sectors on a rotating disk in a disk storage device, the apparatus comprising:
 a disk having a surface for storing data thereon;
 a controller for controlling a rotational speed of the disk;
 at least one head for reading or writing the data;
 an actuator for positioning the head;
 a communications channel for transmitting data to and from the at least one head;
 a timing apparatus for determining the period of time between two adjacent sectors, wherein the period of time between two adjacent sectors relates to phase rotation;
 a selector for switching between a read mode and a write mode;
 a phase-locked loop, responsive to a reference frequency for providing an output clock signal;
 a first interpolator for adjusting the output clock signal responsive to the period of time between two adjacent sectors, wherein the first interpolator is located within the phase-locked loop; and
 a second interpolator, responsive to a pre-compensation adjustment and connected to the phase-locked loop for modifying the output clock signal for synchronously writing data to the rotating disk.

54. The system of claim 53, wherein each sector has a synchronization mark, and wherein the timing apparatus for determining the period of time between sectors measures the time between two consecutive synchronization marks.

55. The system of claim 53, wherein the timing apparatus provides an average of the periods between a plurality of synchronization marks.

56. The system of claim 53, wherein the phase-locked loop further comprises a phase detector, a low pass filter, a voltage controlled oscillator, and a divider, said divider being located in a feedback portion of the phase-locked loop.

57. The system of claim 53, wherein the write mode is configured to connected the first interpolator in the feedback portion of the phase locked loop.

58. The system of claim 53, wherein the read mode is configured to connect the first interpolator to an output of the phase-locked loop.

59. The system of claim 53, wherein the read mode is configured to disable the second interpolator.

60. The system of claim 53, wherein the write mode is configured to enable the first interpolator and to enable the second interpolator.

61. A data recording disk drive system for generating a variable frequency clock signal for synchronously writing data to sectors on a rotating disk in a disk storage device, the apparatus comprising:
   a disk having a surface for storing data thereon;
   a controller for controlling a rotational speed of the disk;
   at least one head for reading or writing the data;
   an actuator for positioning the head;
   a communications channel for transmitting data to and from the at least one head;
   a timing apparatus for determining a period of time between two adjacent sectors, wherein the period of time between two adjacent sectors relates to phase rotation;
   a phase-locked loop, responsive to a reference frequency for providing an output clock signal;
   an interpolator for adjusting the phase-locked loop output clock signal responsive to the period of time between two adjacent sectors, wherein the interpolator modifies the output clock signal for synchronously writing data to a rotating disk.

62. The system of claim 61, wherein each sector has a synchronization mark, and wherein the timing apparatus for determining the period of time between sectors measures the time between two consecutive synchronization marks.

63. The system of claim 61, wherein the timing apparatus provides an average of the periods between a plurality of synchronization marks.

64. The system of claim 61, wherein the phase-locked loop further comprises a phase detector, a low pass filter, a voltage controlled oscillator, and a divider, said divider being located in a feedback portion of the phase-locked loop.

65. An apparatus for generating a variable frequency clock signal for synchronously writing data to sectors on a rotating disk in a disk storage device, the apparatus comprising:
   timing apparatus for determining a period of time between two adjacent sectors, wherein the period of time between two adjacent sectors relates to phase rotation;
   timing means having a feedback loop responsive to a reference frequency for providing an output clock signal;
   first interpolation means for adjusting the output clock signal responsive to the period of time between two adjacent sectors, wherein the first interpolator is located within the timing means; and
   second interpolation means responsive to a pre-compensation adjustment and connected to the timing means for modifying the output clock signal for synchronously writing data to the rotating disk.

66. The apparatus of claim 65, further comprising a means for selecting between a read mode and a write mode.

67. The apparatus of claim 66, wherein the read mode is configured to connect the first interpolation means to an output of the timing means.

68. The apparatus of claim 66, wherein the read mode is configured to disable the second interpolator.

69. The apparatus of claim 66, wherein the write mode is configured to enable the first interpolator and to enable the second interpolator.

70. The apparatus of claim 65, wherein each sector has a synchronization mark, and wherein the means for determining the period of time between sectors measures the time between two consecutive synchronization marks.

71. The apparatus of claim 65, wherein the means for determining the period provides an average of the periods between a plurality of synchronization marks.

72. The apparatus of claim 65, wherein the timing means further comprises a phase detector, a low pass filter, a voltage controlled oscillator, and a divider, said divider being located in the feedback loop.

73. The apparatus of claim 65, wherein the first interpolation means is located in the feedback loop.

74. An apparatus for generating a variable frequency clock signal for synchronously writing data to sectors on a rotating disk in a disk storage device, the apparatus comprising:
   timing apparatus for determining a period of time between two adjacent sectors, wherein the period of time between two adjacent sectors relates to phase rotation;
   means for selecting between a read mode and a write mode;
   timing means having a feedback loop responsive to a reference frequency for providing an output clock signal;
   first interpolation means for adjusting the output clock signal responsive to the period of time between two adjacent sectors, wherein the first interpolator is located within the timing means; and
   second interpolation means responsive to a pre-compensation adjustment and connected to the timing means for modifying the output clock signal for synchronously writing data to the rotating disk.

75. The apparatus of claim 74, wherein each sector has a synchronization mark, and wherein the means for determining the period of time between sectors measures the time between two consecutive synchronization marks.

76. The apparatus of claim 74, wherein the means for determining the period provides an average of the periods between a plurality of synchronization marks.

77. The apparatus of claim 74, wherein the timing means further comprises a phase detector, a low pass filter, a voltage controlled oscillator, and a divider, said divider being located in the feedback loop.

78. The apparatus of claim 74, wherein the write mode is configured to connected the first interpolation means in the feedback loop.

79. The apparatus of claim 74, wherein the read mode is configured to connect the first interpolation means to an output of the timing means.

80. The apparatus of claim 74, wherein the read mode is configured to disable the second interpolator.

81. The apparatus of claim 74, wherein the write mode is configured to enable the first interpolator and to enable the second interpolator.

82. A data recording disk drive system for generating a variable frequency clock signal for synchronously writing data to sectors on a rotating disk in a disk storage device, the apparatus comprising:
   means for storing data on the rotating disk;
   means for controlling a rotational speed of the disk;
   means for reading data from the disk or writing data to the disk;

means for positioning the means for reading or writing data;

means for communicating data to or from the means for reading or writing data;

means for determining the period of time between two adjacent sectors, wherein the period of time between two adjacent sectors relates to phase rotation;

timing means having a feedback loop, responsive to a reference frequency for providing an output clock signal;

first interpolation means for adjusting the output clock signal responsive to the period of time between two adjacent sectors, wherein the first interpolator is located within the timing means; and second interpolation means responsive to a pre-compensation adjustment and connected to the timing means for modifying the output clock signal for synchronously writing data to the rotating disk.

83. The system of claim 82, further comprising a means for selecting between a read mode and a write mode.

84. The system of claim 83, wherein the read mode is configured to connect the first interpolation means to an output of the timing means.

85. The system of claim 82, wherein each sector has a synchronization mark, and wherein the means for determining the period of time between sectors measures the time between two consecutive synchronization marks.

86. The system of claim 82, wherein the means for determining the period of time provides an average of the periods between a plurality of synchronization marks.

87. The system of claim 82, wherein the timing means further comprises a phase detector, a low pass filter, a voltage controlled oscillator, and a divider, said divider being located in the feedback loop.

88. An data recording disk drive system for generating a variable frequency clock signal for synchronously writing data to sectors on a rotating disk in a disk storage device, the apparatus comprising:

means for storing data on the rotating disk;
means for rotating the disk;
means for controlling the rotational speed of the disk;
at least one means for reading data from the disk or writing data to the disk;
means for positioning the means for reading or writing data;
means for communicating data to the means for reading or writing data;
means for determining the period of time between two adjacent sectors, wherein the period of time between two adjacent sectors relates to phase rotation;
means for selecting between a read mode and a write mode;
timing means having a feedback loop, responsive to a reference frequency for providing an output clock signal;
first interpolation means for adjusting the output clock signal responsive to the period of time between two adjacent sectors, wherein the first interpolation means is located within the timing means; and
second interpolation means, responsive to a pre-compensation adjustment and connected to the timing means for modifying the output clock signal for synchronously writing data to the rotating disk.

89. The system of claim 88, wherein each sector has a synchronization mark, and wherein the means for determining the period of time between sectors measures the time between two consecutive synchronization marks.

90. The system of claim 88, wherein the means for determining the period provides an average of the periods between a plurality of synchronization marks.

91. The system of claim 88, wherein the timing means further comprises a phase detector, a low pass filter, a voltage controlled oscillator, and a divider, said divider being located in the feedback loop.

92. The system of claim 88, wherein the write mode is configured to connected the first interpolation means in the feedback loop.

93. The system of claim 88, wherein the read mode is configured to connect the first interpolation means to an output of the timing means.

94. The system of claim 88, wherein the read mode is configured to disable the second interpolator.

95. The system of claim 88, wherein the write mode is configured to enable the first interpolator and to enable the second interpolator.

96. An data recording disk drive system for generating a variable frequency clock signal for synchronously writing data to sectors on a rotating disk in a disk storage device, the apparatus comprising:

means for storing data on the rotating disk;
means for rotating the disk;
means for controlling the rotational speed of the disk;
at least one means for reading data from the disk or writing data to the disk;
means for positioning the means for reading or writing data;
means for communicating data to the means for reading or writing data;
means for determining the period of time between two adjacent sectors, wherein the period of time between two adjacent sectors relates to phase rotation;
timing means having a feedback loop, responsive to a reference frequency for providing an output clock signal;
interpolation means for adjusting the timing means output clock signal responsive to the period of time between two adjacent sectors, wherein the interpolation means modifies the output clock signal for synchronously writing data to a rotating disk.

97. The system of claim 96, wherein each sector has a synchronization mark, and wherein the means for determining the period of time between sectors measures the time between two consecutive synchronization marks.

98. The system of claim 96, wherein the means for determining the period provides an average of the periods between a plurality of synchronization marks.

99. The system of claim 96, wherein the timing means further comprises a phase detector, a low pass filter, a voltage controlled oscillator, and a divider, said divider being located in the feedback loop.

* * * * *